United States Patent
Tawara

(10) Patent No.: US 10,796,906 B2
(45) Date of Patent: Oct. 6, 2020

(54) SILICON CARBIDE SEMICONDUCTOR SUBSTRATE, METHOD OF MANUFACTURING SILICON CARBIDE SEMICONDUCTOR SUBSTRATE, SEMICONDUCTOR DEVICE, AND METHOD OF MANUFACTURING SEMICONDUCTOR DEVICE

(71) Applicant: FUJI ELECTRIC CO., LTD., Kawasaki-shi, Kanagawa (JP)

(72) Inventor: Takeshi Tawara, Tsukuba (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 16/853,683

(22) Filed: Apr. 20, 2020

(65) Prior Publication Data

US 2020/0251333 A1   Aug. 6, 2020

Related U.S. Application Data

(63) Continuation of application No. 15/827,510, filed on Nov. 30, 2017, now Pat. No. 10,629,432, which is a
(Continued)

(30) Foreign Application Priority Data

Dec. 18, 2015 (JP) ................. 2015-247955
Jul. 29, 2016 (JP) ................. 2016-150855

(51) Int. Cl.
    H01L 21/02    (2006.01)
    H01L 29/36    (2006.01)
    (Continued)

(52) U.S. Cl.
    CPC ...... H01L 21/02529 (2013.01); C30B 25/183 (2013.01); C30B 25/20 (2013.01);
    (Continued)

(58) Field of Classification Search
    CPC ........... H01L 21/02529; H01L 29/1608; H01L 29/868
    (Continued)

(56) References Cited

U.S. PATENT DOCUMENTS

2008/0203487 A1   8/2008  Hohage et al.
2009/0061645 A1   3/2009  Richter et al.
(Continued)

FOREIGN PATENT DOCUMENTS

JP   2007250693 A   9/2007
JP   2009088223 A   4/2009
(Continued)

OTHER PUBLICATIONS

J.J. Sumakeris et al, "Approaches to Stabilizing the Forward Voltage of Bipolar SiC Devices", (USA), Materials Science Forum, On-line vol. 457-460, pp. 1113-1116, 2004.

*Primary Examiner* — Sheikh Maruf
(74) *Attorney, Agent, or Firm* — Rabin & Berdo, P.C.

(57) ABSTRACT

A silicon carbide semiconductor substrate includes a silicon carbide substrate of a first conductivity type, an epitaxial layer of the first conductivity type provided on a front surface of the silicon carbide substrate, an impurity concentration of the epitaxial layer being $1\times10^{17}/cm^3$ to $1\times10^{18}/cm^3$, and a film thickness of the epitaxial layer being 1 µm to 5 µm. The silicon carbide semiconductor substrate further includes a buffer layer of the first conductivity type provided on a surface of a first side of the epitaxial layer opposite a second side facing the silicon carbide substrate, an impurity concentration of the buffer layer being about a same as that of the silicon carbide substrate, and a drift layer of the first conductivity type provided on a surface of a first side of the buffer layer opposite a second side facing toward the silicon carbide substrate, an impurity concentration of the drift layer being lower than that of the buffer layer.

9 Claims, 7 Drawing Sheets

Related U.S. Application Data continuation of application No. PCT/JP2016/087389, filed on Dec. 15, 2016.

(51) Int. Cl.

| | |
|---|---|
| *H01L 29/32* | (2006.01) |
| *C30B 25/20* | (2006.01) |
| *C30B 29/36* | (2006.01) |
| *H01L 29/861* | (2006.01) |
| *H01L 29/868* | (2006.01) |
| *H01L 29/16* | (2006.01) |
| *C30B 25/18* | (2006.01) |
| *H01L 29/78* | (2006.01) |
| *H01L 29/739* | (2006.01) |

(52) U.S. Cl.
CPC .......... *C30B 29/36* (2013.01); *H01L 29/1608* (2013.01); *H01L 29/36* (2013.01); *H01L 29/861* (2013.01); *H01L 29/868* (2013.01); *H01L 29/8611* (2013.01); *H01L 29/32* (2013.01); *H01L 29/7393* (2013.01); *H01L 29/7802* (2013.01)

(58) Field of Classification Search
USPC ...................................... 438/783; 257/77, 84
See application file for complete search history.

(56) References Cited

U.S. PATENT DOCUMENTS

| | | | |
|---|---|---|---|
| 2009/0085044 A1 | 4/2009 | Ohno et al. | |
| 2009/0186470 A1* | 7/2009 | Takahashi | H01L 29/6606 438/522 |
| 2011/0233562 A1 | 9/2011 | Harada et al. | |
| 2012/0025153 A1 | 2/2012 | Hirose et al. | |
| 2012/0153398 A1 | 6/2012 | Baars et al. | |
| 2012/0241766 A1* | 9/2012 | Ohtsuka | C30B 25/02 257/77 |
| 2012/0313139 A1* | 12/2012 | Matsuura | H01L 29/0615 257/139 |
| 2013/0099253 A1 | 4/2013 | Ohtsuka et al. | |
| 2013/0330898 A1 | 12/2013 | Liao et al. | |
| 2014/0001561 A1 | 1/2014 | Cheng et al. | |
| 2014/0284623 A1 | 9/2014 | Ota et al. | |
| 2014/0374774 A1 | 12/2014 | Tanaka et al. | |
| 2015/0087125 A1* | 3/2015 | Nishio | H01L 29/66068 438/285 |
| 2015/0129973 A1 | 5/2015 | Ji et al. | |
| 2016/0086799 A1 | 3/2016 | Hiyoshi | |
| 2016/0104614 A1 | 4/2016 | Hasegawa et al. | |
| 2016/0197155 A1 | 7/2016 | Hiyoshi | |
| 2016/0254149 A1* | 9/2016 | Genba | H01L 21/0262 438/478 |
| 2016/0268381 A1 | 9/2016 | Ota et al. | |
| 2016/0336392 A1* | 11/2016 | Tominaga | H01L 29/063 |
| 2017/0047408 A1 | 2/2017 | Kuribayashi et al. | |
| 2018/0174835 A1 | 6/2018 | Fukuda et al. | |
| 2018/0202070 A1* | 7/2018 | Asamizu | H01L 21/0262 |
| 2018/0315842 A1* | 11/2018 | Tawara | H01L 29/1608 |
| 2018/0323263 A1* | 11/2018 | Tawara | H01L 21/02634 |
| 2019/0040545 A1* | 2/2019 | Nakamura | H01L 29/1608 |
| 2019/0252503 A1* | 8/2019 | Uehigashi | H01L 29/7813 |
| 2019/0333988 A1* | 10/2019 | Furuhashi | H01L 29/0882 |
| 2019/0355820 A1* | 11/2019 | Wada | H01L 21/0262 |

FOREIGN PATENT DOCUMENTS

| | | |
|---|---|---|
| JP | 2012031014 A | 2/2012 |
| WO | 2012026234 A1 | 3/2012 |
| WO | 2016059670 A1 | 4/2016 |

* cited by examiner

FIG.4

| | n-TYPE IMPURITY DOPING CONCENTRATION [cm-3] | | | THICKNESS [μm] | |
|---|---|---|---|---|---|
| | SUBSTRATE | EPI LAYER | BUFFER LAYER | EPI LAYER | BUFFER LAYER |
| EXAMPLE A | 5.0E+18 | 1.0E+18 | 1.0E+18 | 1 | 30 |
| EXAMPLE B | 5.0E+18 | 1.0E+18 | 3.0E+18 | 1 | 30 |
| EXAMPLE C | 5.0E+18 | 1.0E+18 | 5.0E+18 | 1 | 30 |
| EXAMPLE D | 5.0E+18 | 1.0E+18 | 8.5E+18 | 1 | 30 |

SILICON CARBIDE SEMICONDUCTOR SUBSTRATE, METHOD OF MANUFACTURING SILICON CARBIDE SEMICONDUCTOR SUBSTRATE, SEMICONDUCTOR DEVICE, AND METHOD OF MANUFACTURING SEMICONDUCTOR DEVICE

CROSS REFERENCE TO RELATED APPLICATIONS

This is a continuation application of U.S. patent application Ser. No. 15/827,510 filed on Nov. 30, 2017, which is a continuation of International Application PCT/JP2016/087389 filed on Dec. 15, 2016 which claims priority from a Japanese Patent Application Nos. 2015-247955 filed on Dec. 18, 2015, and 2016-150855 filed on Jul. 29, 2016. The disclosures of these prior U.S. and foreign applications are incorporated herein by reference.

BACKGROUND OF THE INVENTION

1. Field of the Invention

Embodiments of the invention relate to a silicon carbide semiconductor substrate, a method of manufacturing a silicon carbide semiconductor substrate, a semiconductor device, and a method of manufacturing a semiconductor device.

2. Description of the Related Art

An epitaxial wafer (silicon carbide semiconductor substrate, hereinafter, simply, substrate) in which silicon carbide (SiC) is formed on a substrate by epitaxial growth contains many crystal defects/dislocations and these crystal defects/dislocations are thought to adversely affect the properties of the silicon carbide semiconductor device. In particular, basal plane dislocations (BPDs) in a layer formed by epitaxial growth expand to stacked defects with bipolar operation of the semiconductor device whereby the flow of current becomes difficult, thereby increasing the ON voltage of the semiconductor device and leading to bipolar degradation.

BPDs are present in the substrate at a density of several hundred to several thousand/cm$^2$. Many of the BPDs are converted into threading edge dislocations (TED) during epitaxial growth. Nonetheless, after the epitaxial growth, BPDs remain in the substrate at a density of 1 to 100/cm$^2$. In this state, when excessive current flows with bipolar operation of a silicon carbide semiconductor device produced (manufactured) from the substrate, BPDs in the substrate expand whereby triangular/bar-shaped stacking faults are generated.

FIG. 6 is a top view schematic of photographed photoluminescence of stacking faults occurring in a conventional silicon carbide semiconductor substrate. FIG. 6 depicts results of photoluminescence measurements performed with respect to a substrate at room temperature by using a bandpass filter in the vicinity of 420 nm after about 1 hour of bipolar operation of a pin (p-intrinsic-n) diode at a current density of 600 A/cm$^2$ and peeling of the anode electrode, the pin diode being formed from the conventional silicon carbide semiconductor substrate. In FIG. 6, in the substrate, light emitting states of both a long, bar-shaped stacking fault extending between left and right ends of the substrate and multiple triangular-shaped stacking faults are shown.

Factors causing the bar-shaped stacking fault and the triangular-shaped stacking faults include electron-hole recombination. To suppress this recombination, there is a technique that prevents excessive hole injection to the substrate by forming a thick buffer layer on the substrate by epitaxial growth (hereinafter, epi growth) (e.g., refer to J. J. Sumakeris, et al, "Approaches to Stabilizing the Forward Voltage of Bipolar SiC Devices", (USA), Materials Science Forum, On-line Vol. 457-460, 2004, pp. 1113-1116).

SUMMARY OF THE INVENTION

According to one embodiment of the invention, a silicon carbide semiconductor substrate includes a silicon carbide substrate of a first conductivity type; an epitaxial layer of the first conductivity type provided on a front surface of the silicon carbide substrate, an impurity concentration of the epitaxial layer being $1\times10^{17}/cm^3$ to $1\times10^{18}/cm^3$, and a film thickness of the epitaxial layer being 1 μm to 5 μm; a buffer layer of the first conductivity type provided on a surface of a first side of the epitaxial layer opposite a second side facing the silicon carbide substrate, an impurity concentration of the buffer layer being about a same impurity concentration as that of the silicon carbide substrate; and a drift layer of the first conductivity type provided on a surface of a first side of the buffer layer opposite a second side facing toward the silicon carbide substrate, an impurity concentration of the drift layer being lower than that of the buffer layer.

In the embodiment, the impurity concentration of the buffer layer is 3 times the impurity concentration of the epitaxial layer or more, and a thickness of the buffer layer is 3 μm or more.

According to another embodiment of the invention, a method of manufacturing a silicon carbide semiconductor substrate includes forming, on a front surface of a silicon carbide substrate, an epitaxial layer of a first conductivity type, an impurity concentration of the epitaxial layer being $1\times10^{17}/cm^3$ to $1\times10^{18}/cm^3$, and a film thickness of the epitaxial layer being 1 μm to 5 μm; forming a buffer layer of the first conductivity type on a surface of a first side of the epitaxial layer opposite a second side facing the silicon carbide substrate, an impurity concentration of the buffer layer being about a same impurity concentration as that of the silicon carbide substrate; and forming a drift layer of the first conductivity type on a surface of a first side of the buffer layer opposite a second side facing toward the silicon carbide substrate, an impurity concentration of the buffer layer being lower than that of the buffer layer.

In the embodiment, the impurity concentration of the buffer layer is 3 times the impurity concentration of the epitaxial layer or more, and a thickness of the buffer layer is 3 μm or more.

According to another embodiment of the invention, a semiconductor device includes a silicon carbide semiconductor substrate that includes a silicon carbide substrate of a first conductivity type; an epitaxial layer of the first conductivity type provided on a front surface of the silicon carbide substrate, an impurity concentration of the epitaxial layer being $1\times10^{7}/cm^3$ to $1\times10^{18}/cm^3$, and a film thickness of the epitaxial layer being 1 μm to 5 μm; a buffer layer of the first conductivity type provided on a surface of a first side of the epitaxial layer opposite a second side facing the silicon carbide substrate, an impurity concentration of the buffer layer being about a same impurity concentration as that of the silicon carbide substrate; and a drift layer of the first conductivity type provided on a surface of a first side of the buffer layer opposite a second side facing toward the silicon carbide substrate, an impurity concentration of the drift layer being lower than that of the buffer layer.

In the embodiment, the impurity concentration of the buffer layer is 3 times the impurity concentration of the epitaxial layer or more, and a thickness of the buffer layer is 3 µm or more.

According to another embodiment of the invention, a method of manufacturing a semiconductor device includes using a silicon carbide semiconductor substrate that includes a silicon carbide substrate of a first conductivity type; an epitaxial layer of the first conductivity type provided on a front surface of the silicon carbide substrate, an impurity concentration of the epitaxial layer being $1\times10^{17}/cm^3$ to $1\times10^{18}/cm^3$, and a film thickness of the epitaxial layer being 1 µm to 5 µm; a buffer layer of the first conductivity type provided on a surface of a first side of the epitaxial layer opposite a second side facing the silicon carbide substrate, an impurity concentration of the buffer layer being about a same impurity concentration as that of the silicon carbide substrate; and a drift layer of the first conductivity type provided on a surface of a first side of the buffer layer opposite a second side facing toward the silicon carbide substrate, an impurity concentration of the drift layer being lower than that of the buffer layer.

In the embodiment, the impurity concentration of the buffer layer is 3 times the impurity concentration of the epitaxial layer or more, and a thickness of the buffer layer is 3 µm or more.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 4 is a table of impurity concentrations and thicknesses of each layer in examples of the silicon carbide semiconductor substrate according to the embodiment;

DETAILED DESCRIPTION OF THE INVENTION

With conventional techniques, formation of a thick buffer layer leads to increased cost due to decreased epi growth throughput, decreased yield due to increased defect density, and increased substrate resistance. In this regard, one conventional silicon carbide semiconductor substrate (hereinafter, stacking-fault-suppressing semiconductor substrate) has been proposed in which the buffer layer is formed to have an impurity concentration that is about the same as that of the substrate whereby the thickness of the buffer layer may be suppressed, enabling the stacking-fault-suppressing semiconductor substrate to effectively suppress the occurrence of triangular/bar-shaped stacking faults in the substrate even when bipolar operation is performed using large current.

Figure 7:
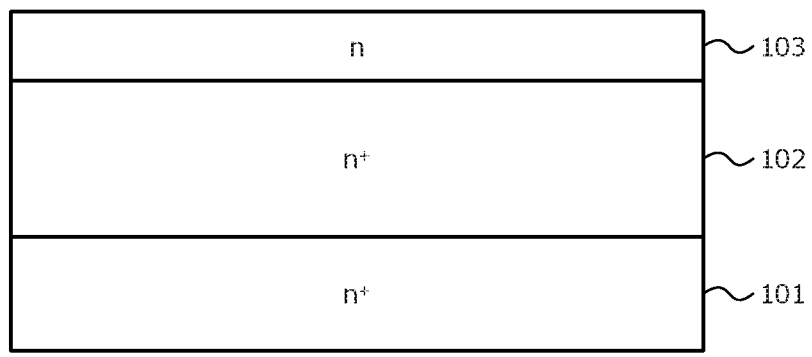
FIG. 7 is a cross-sectional view of the stacking-fault-suppressing semiconductor substrate.

FIG. 7 is a cross-sectional view of the stacking-fault-suppressing semiconductor substrate. As depicted in FIG. 7, in a stacking-fault-suppressing substrate, an $n^+$-type silicon carbide buffer layer 102 is deposited on a first main surface (front surface), for example, a (0001) plane (Si face) of an $n^+$-type silicon carbide substrate 101.

The $n^+$-type silicon carbide substrate 101 is a silicon carbide, single crystal substrate doped with, for example, nitrogen (N). The $n^+$-type silicon carbide buffer layer 102 is a buffer layer doped with, for example, nitrogen and has an impurity concentration that is about the same as that of the $n^+$-type silicon carbide substrate 101. On a surface side of the $n^+$-type silicon carbide buffer layer 102 opposite the side facing the $n^+$-type silicon carbide substrate 101, an n-type drift layer 103 is formed. The n-type drift layer 103 is a drift layer doped with, for example, nitrogen and has an impurity concentration that is lower than that of the $n^+$-type silicon carbide substrate 101 and that of the $n^+$-type silicon carbide buffer layer 102.

The stacking-fault-suppressing semiconductor substrate promotes electron-hole recombination in the $n^+$-type silicon carbide buffer layer 102 and suppresses the hole density injected into the $n^+$-type silicon carbide substrate 101 to thereby effectively suppress the occurrence of triangular/bar-shaped stacking faults.

Nonetheless, in the stacking-fault-suppressing semiconductor substrate, the impurity concentrations of the $n^+$-type silicon carbide substrate 101 and the $n^+$-type silicon carbide buffer layer 102 are about the same and therefore, the reflection of infrared light by an interface of the $n^+$-type silicon carbide substrate 101 and the $n^+$-type silicon carbide buffer layer 102 decreases.

Figure 8:
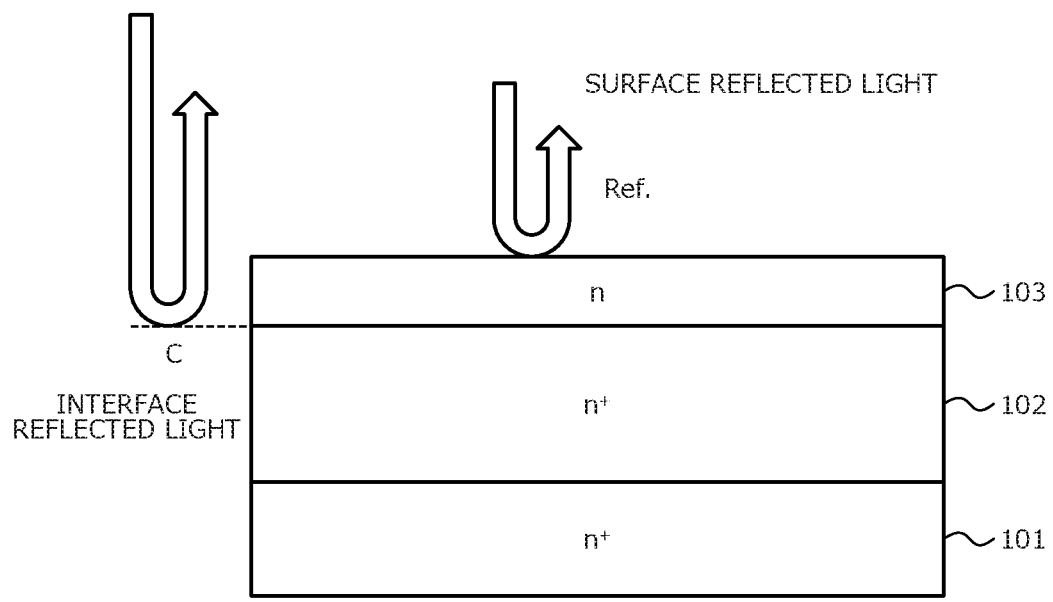
FIG. 8 is a diagram of infrared light reflection of the stacking-fault-suppressing semiconductor substrate.

FIG. 8 is a diagram of infrared light reflection of the stacking-fault-suppressing semiconductor substrate. As depicted in FIG. 8, infrared rays incident on the stacking-fault-suppressing semiconductor substrate are reflected by the surface of the stacking-fault-suppressing semiconductor substrate and returned as surface reflected light Ref. Because the impurity concentrations of the $n^+$-type silicon carbide buffer layer 102 and the n-type drift layer 103 differ, the infrared rays are reflected by an interface of the $n^+$-type silicon carbide buffer layer 102 and the n-type drift layer 103 and are returned as interface reflected light C. However, since the impurity concentrations of the $n^+$-type silicon carbide substrate 101 and the $n^+$-type silicon carbide buffer layer 102 are about the same, the interface reflected light is minimally reflected by the interface of the $n^+$-type silicon carbide substrate 101 and the $n^+$-type silicon carbide buffer layer 102 and thus, the interface reflected light is not returned.

Figure 9:
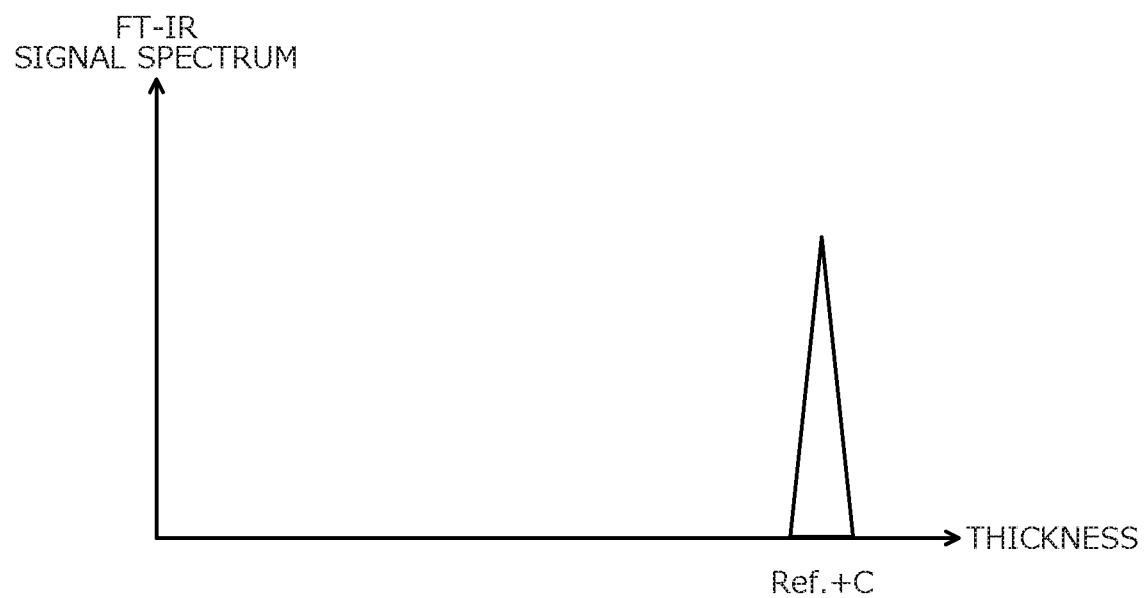
FIG. 9 is a graph schematically depicting Fourier Transform Infrared Spectroscopy (FT-IR) of the stacking-fault-suppressing semiconductor substrate.

FIG. 9 is a graph schematically depicting Fourier Transform Infrared Spectroscopy (FT-IR) of the stacking-fault-suppressing semiconductor substrate. The horizontal axis represents film thickness and the vertical axis represents the FT-IR signal spectrum. As depicted in FIG. 9, an interference waveform of the stacking-fault-suppressing semiconductor substrate is only the interference waveform (Ref.+C)

of the interface reflected light C from the interface of the n+-type silicon carbide buffer layer 102 and the n-type drift layer 103, and the surface reflected light Ref. since there is no interface reflected light from the interface of the n+-type silicon carbide substrate 101 and the n+-type silicon carbide buffer layer 102. Therefore, the film thickness of the n+-type silicon carbide buffer layer 102 cannot be measured. Thus, as described, a problem arises in that in the stacking-fault-suppressing semiconductor substrate, the film thickness of the n+-type silicon carbide buffer layer 102 cannot be measured by a conventional FT-IR method (Fourier Transform Infrared Spectroscopy). Further, since the film thickness of the buffer layer 2 cannot be measured accurately, the problems of decreased yield of the silicon carbide semiconductor substrate and increased substrate resistance cannot be resolved.

Embodiments of a silicon carbide semiconductor substrate, a method of manufacturing a silicon carbide semiconductor substrate, a semiconductor device, and a method of manufacturing a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. Cases where symbols such as n's and p's that include + or − are the same indicate that concentrations are close and therefore, the concentrations are not necessarily equal. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index.

Figure 1:
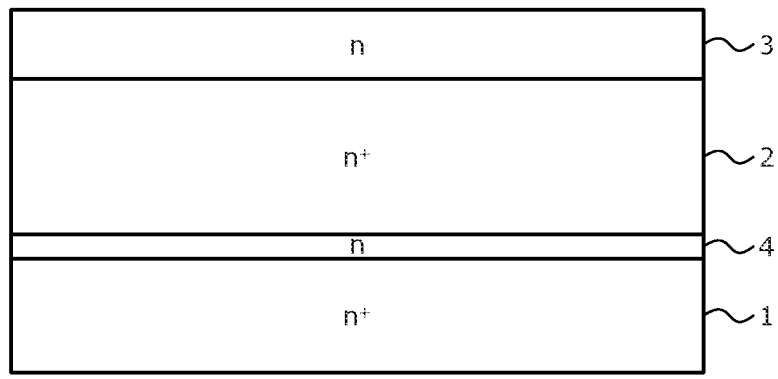
FIG. 1 is a cross-sectional view of a silicon carbide semiconductor substrate according to an embodiment.

FIG. 1 is a cross-sectional view of a silicon carbide semiconductor substrate according to an embodiment. As depicted in FIG. 1, in the silicon carbide semiconductor substrate according to the embodiment, an n-type epitaxial layer (epitaxial layer of a first conductivity type) 4 is deposited on a first main surface (front surface), e.g., (0001) plane (Si face), of an n+-type silicon carbide substrate (silicon carbide substrate of the first conductivity type) 1.

The n+-type silicon carbide substrate 1, for example, is a silicon carbide, single crystal substrate doped with nitrogen. An impurity concentration of the n+-type silicon carbide substrate 1 is, for example, $1 \times 10^{18}/cm^3$ or higher, $2 \times 10^{19}/cm^3$ or less. The n-type epitaxial layer 4 has an impurity concentration that is lower than that of the n+-type silicon carbide substrate 1 and lower than that of an n+-type silicon carbide buffer layer (buffer layer of the first conductivity type) 2 described hereinafter. The n-type epitaxial layer 4 is an epitaxial layer doped with, for example, nitrogen. Further, an impurity concentration of the n-type epitaxial layer 4 may be ⅓ or less of the impurity concentration of the n+-type silicon carbide substrate 1 or ⅓ or less of the impurity concentration of the n+-type silicon carbide buffer layer 2. As described in detail below, the reason for this is that at an interface of the n+-type silicon carbide substrate 1 and the n-type epitaxial layer 4 or an interface of the n+-type silicon carbide buffer layer 2 and the n-type epitaxial layer 4, interface reflected light necessary for measuring the film thickness of the n+-type silicon carbide buffer layer 2 is obtained. Further, the film thickness of the n-type epitaxial layer 4 may be less than 5 μm because when the film thickness is too thick, the resistance increases due to the n-type epitaxial layer 4. The impurity concentration of the n-type epitaxial layer 4 may be $1 \times 10^{17}/cm^3$ or higher because when the impurity concentration is too low, the resistance increases due to the n-type epitaxial layer 4.

Here, the impurity concentration of the n-type epitaxial layer 4 may be $1 \times 10^{18}/cm^3$ or less, and the film thickness of the n-type epitaxial layer 4 may be 1 μm or more. As a result, it becomes possible to detect basal plane dislocations occurring in the n-type epitaxial layer 4 using fluorescence by photoluminescence.

Here, from the experience of the inventors, in order to detect basal plane dislocations with high contrast by photoluminescence, a sufficient amount of free carriers has to be present. However, when a layer having a high impurity concentration is provided like in a conventional device, a non-radiative recombination process becomes dominant in the layer whereby the amount of carriers necessary for the luminescence of the basal plane dislocations cannot be secured, making detection of basal plane dislocations difficult.

In contrast, in the present invention, the n-type epitaxial layer 4 having a low concentration is provided whereby it becomes possible to detect generated basal plane dislocations by fluorescence. Therefore, it becomes possible to detect and remove elements in which stacking faults have a possibility of occurring, whereby inspections conventionally performed after manufacturing may be omitted, enabling reductions in cost.

On a surface side of the n-type epitaxial layer 4 opposite the side facing the n+-type silicon carbide substrate 1, the n+-type silicon carbide buffer layer 2 is provided. The n+-type silicon carbide buffer layer 2 is a buffer layer doped with, for example, nitrogen and has an impurity concentration that is about the same as that of the n+-type silicon carbide substrate 1. On a surface side of the n+-type silicon carbide buffer layer 2 opposite the side facing the n+-type silicon carbide substrate 1, an n-type drift layer (drift layer of the first conductivity type) 3 is formed. The n-type drift layer 3 is a drift layer doped with, for example, nitrogen and has an impurity concentration that is lower than that of the n+-type silicon carbide substrate 1 and that of the n+-type silicon carbide buffer layer 2.

A method of manufacturing a silicon carbide semiconductor substrate according to the embodiment will be described. First, the n+-type silicon carbide substrate 1 containing silicon carbide of an n-type is prepared. The n+-type silicon carbide substrate 1 is, for example, a silicon carbide, single crystal substrate having an impurity concentration of $5 \times 10^{18}/cm^3$. On the first main surface of the n+-type silicon carbide substrate 1, the n-type epitaxial layer 4 containing silicon carbide is formed by epitaxial growth to have a thickness of, for example, about 5 μm while an n-type impurity, e.g., nitrogen atoms, is doped. The dose at the time of ion implantation for forming the n-type epitaxial layer 4 may set to be such that, for example, the impurity concentration becomes about $1 \times 10^{18}/cm^3$.

Next, on a surface of the n-type epitaxial layer 4, the n+-type silicon carbide buffer layer 2 is formed by epitaxial growth to have a thickness of, for example, about 30 μm while an n-type impurity, e.g., nitrogen atoms, is doped. The dose at the time of ion implantation for forming the n+-type silicon carbide buffer layer 2 may be set such that, for example, the impurity concentration becomes about $5 \times 10^{18}/cm^3$. As a result, the impurity concentration of the n+-type silicon carbide buffer layer 2 becomes about the same as the impurity concentration of the n+-type silicon carbide substrate 1. The impurity concentration of the n+-type silicon carbide buffer layer 2 may be $1\times10^{18}$/cm$^3$ to $2\times10^{19}$/cm$^3$. The impurity concentration of the n$^+$-type silicon carbide buffer layer 2 is $7\times10^{18}$/cm$^3$ or higher and the thickness is 3 µm or more, whereby even when the impurity concentration of the n-type epitaxial layer 4 is low, stacking faults are suppressed.

Next, on the surface of the n$^+$-type silicon carbide buffer layer 2, the n-type drift layer 3 is formed by epitaxial growth to have a thickness of, for example, about 10 µm while an n-type impurity, e.g., nitrogen atoms, is doped. The dose at the time of ion implantation for forming the n-type drift layer 3 may be set such that, for example, the impurity concentration becomes about $1\times10^{16}$/cm$^3$. As described, the silicon carbide semiconductor substrate depicted in FIG. 1 is completed.

Figure 2:
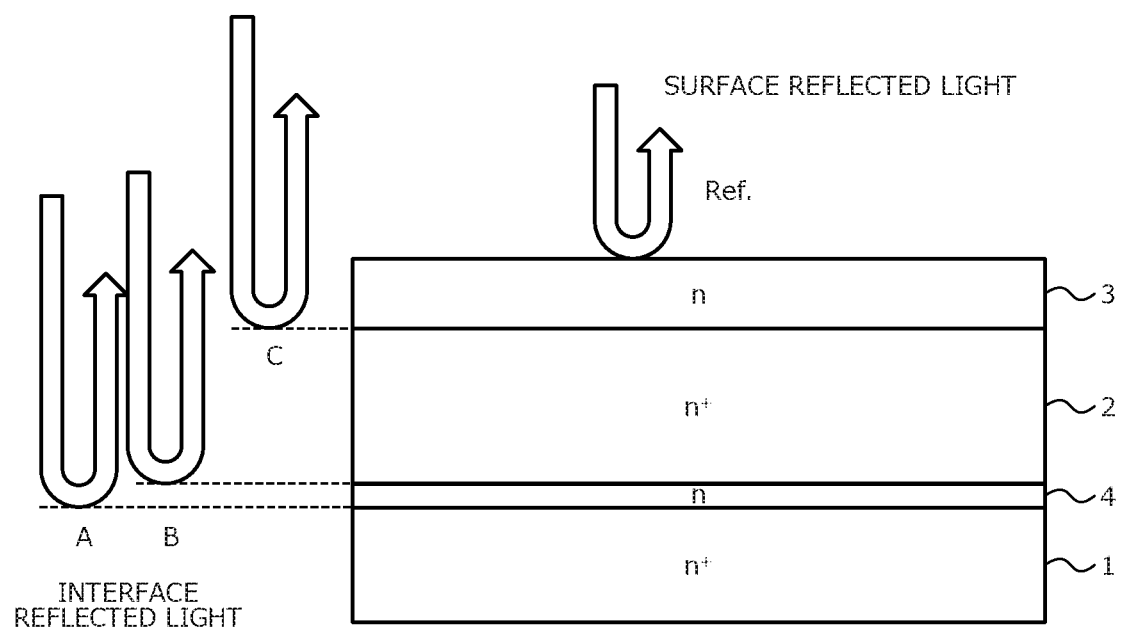
FIG. 2 is a diagram of infrared light reflection of the silicon carbide semiconductor substrate according to the embodiment.

FIG. 2 is a diagram of infrared light reflection of the silicon carbide semiconductor substrate according to the embodiment. As depicted in FIG. 2, infrared rays incident on the silicon carbide semiconductor substrate according to the embodiment are reflected by the surface of the silicon carbide semiconductor substrate and returned as surface reflected light Ref. Further, because the impurity concentrations of the n$^+$-type silicon carbide substrate 1 and the n-type epitaxial layer 4 differ, the infrared rays are reflected by the interface of the n$^+$-type silicon carbide substrate 1 and the n-type epitaxial layer 4 and are returned as interface reflected light A. Because the impurity concentrations of the n-type epitaxial layer 4 and the n$^+$-type silicon carbide buffer layer 2 differ, the infrared rays are reflected by the interface of the n-type epitaxial layer 4 and the n$^+$-type silicon carbide buffer layer 2 and are returned as interface reflected light B. Because the impurity concentrations of the n$^+$-type silicon carbide buffer layer 2 and the n-type drift layer 3 differ, the infrared rays are reflected by the interface of the n$^+$-type silicon carbide buffer layer 2 and the n-type drift layer 3 and returned as the interface reflected light C.

Figure 3:
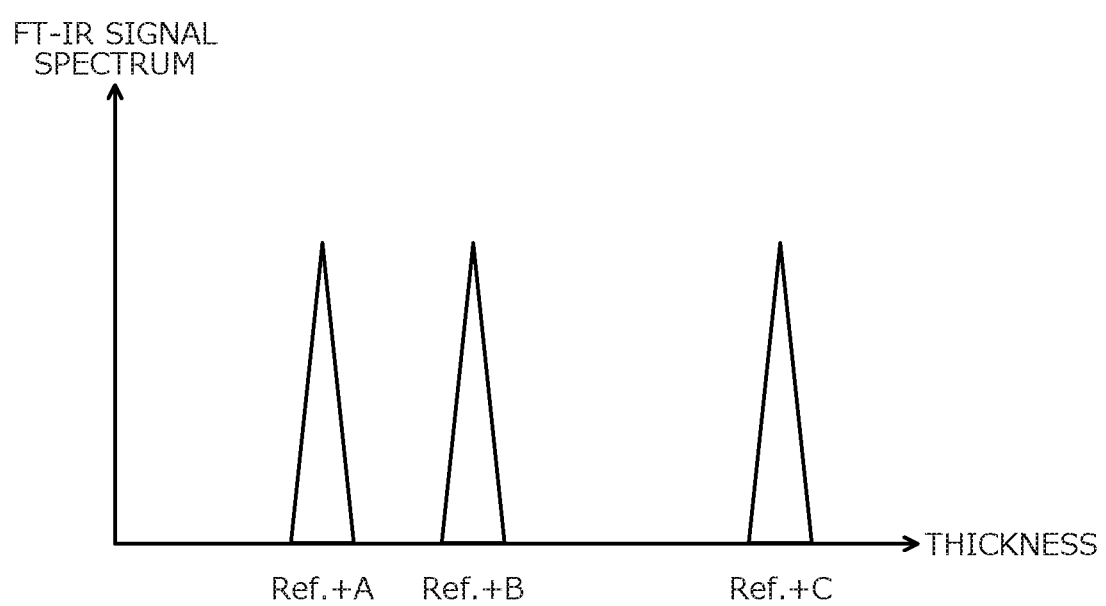
FIG. 3 is a graph schematically depicting FT-IR interference waveforms of the silicon carbide semiconductor substrate according to the embodiment.
Figure 5A:
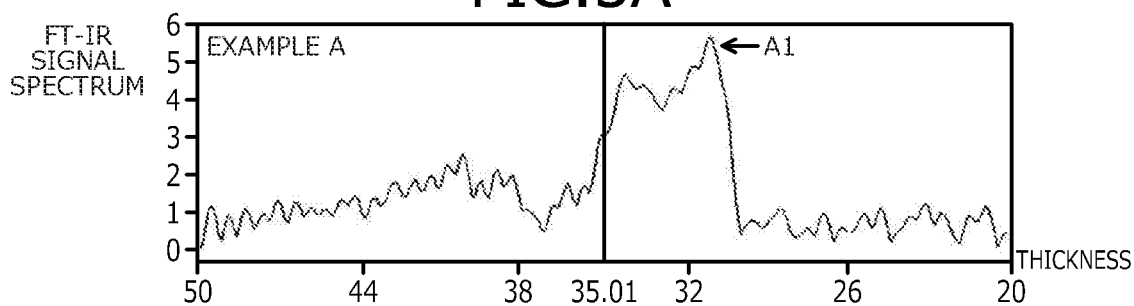
FIGS. 5A, 5B, 5C, and 5D are graphs of a FT-IR signal in the examples of the silicon carbide semiconductor substrate according to the embodiment.
Figure 5B:
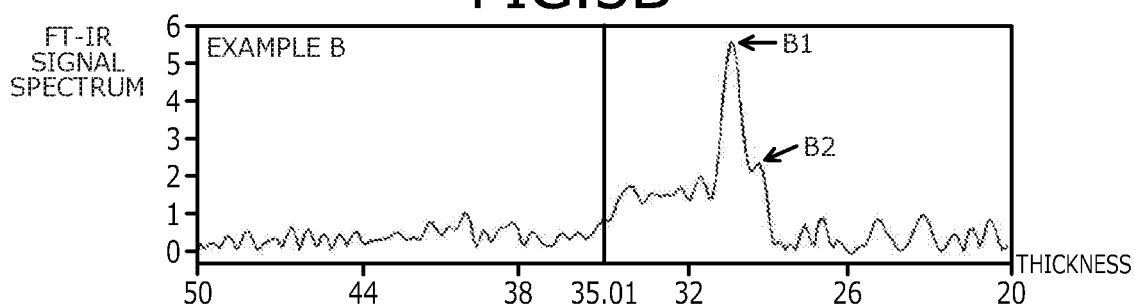
Figure 5C:
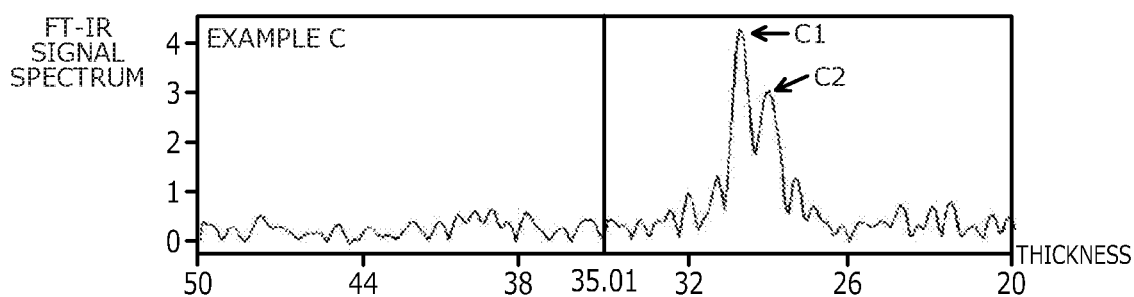
Figure 5D:
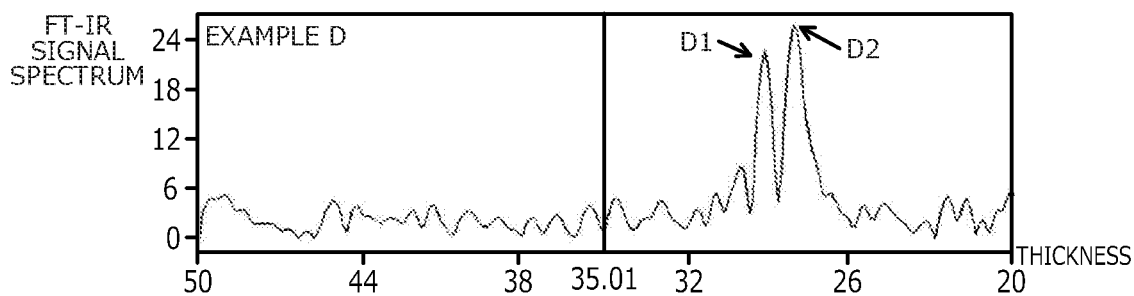
Figure 6:
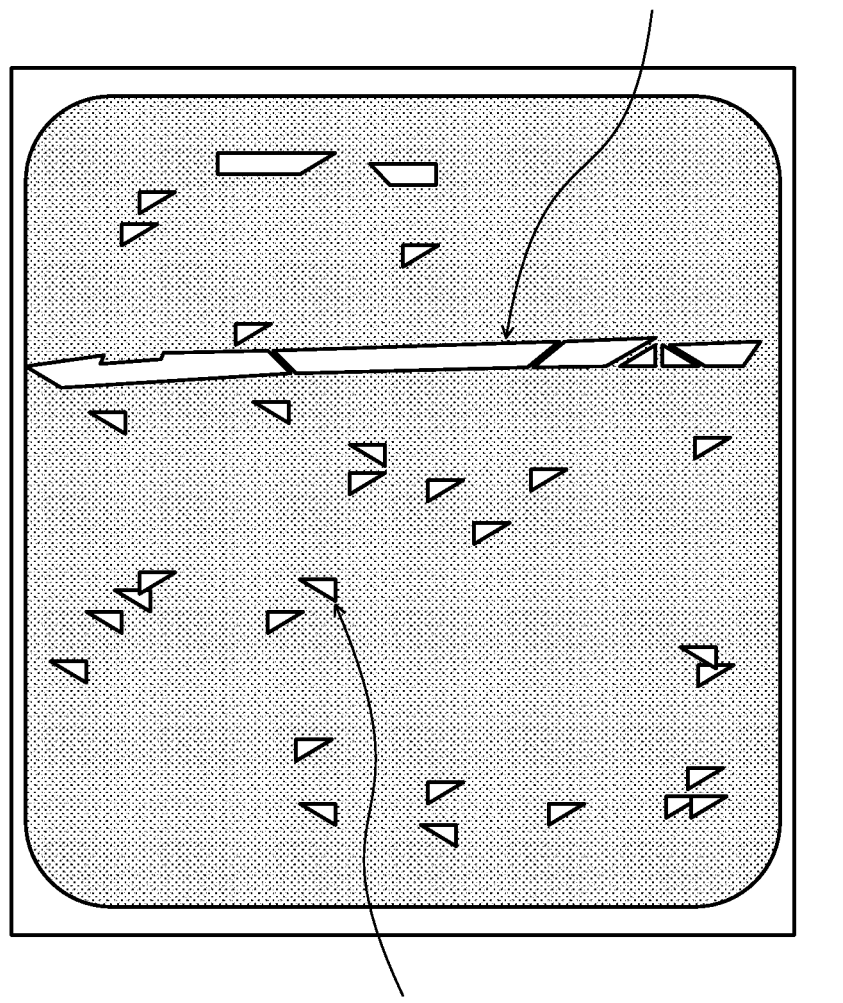
FIG. 6 is a top view schematic of photographed photoluminescence of stacking faults occurring in a conventional silicon carbide semiconductor substrate.

FIG. 3 is a graph schematically depicting FT-IR interference waveforms of the silicon carbide semiconductor substrate according to the embodiment. The horizontal axis represents film thickness and the vertical axis represents FT-IR signal spectrum. As depicted in FIG. 3, of the FT-IR interference waveforms of the silicon carbide semiconductor substrate according to the embodiment, interference waveform (Ref.+A) of the surface reflected light Ref. and the interface reflected light A, interference waveform (Ref.+B) of the surface reflected light Ref. and the interface reflected light B, and interference waveform (Ref.+C) of the surface reflected light Ref. and the interface reflected light C are measured. Thus, it becomes possible to measure the film thickness of the n$^+$-type silicon carbide buffer layer 2 by Fourier transform from the interference waveform of the surface reflected light Ref. and the interface reflected light B and the interference waveform of the surface reflected light Ref. and the interface reflected light C.

FIG. 4 is a table of impurity concentrations and thicknesses of each layer in examples of the silicon carbide semiconductor substrate according to the embodiment. In the example, the impurity concentration and the thickness of the n$^+$-type silicon carbide substrate 1 (in FIG. 4, indicated as substrate) are fixed at $5.0\times10^{18}$/cm$^3$ and 350 µm, respectively. Further, the impurity concentration and the thickness of the n-type epitaxial layer 4 (in FIG. 4, indicated as epi layer) are fixed at $1.0\times10^{18}$/cm$^3$ and 1 µm, respectively. The thickness of the n$^+$-type silicon carbide buffer layer 2 (in FIG. 4, indicated as buffer layer) is fixed at 30 µm and the impurity concentration is varied.

Here, the impurity concentration of the n$^+$-type silicon carbide buffer layer 2 was $1.0\times10^{18}$/cm$^3$ in example A, $3.0\times10^{18}$/cm$^3$ in example B, $5.0\times10^{18}$/cm$^3$ in example C, and $8.5\times10^{18}$/cm$^3$ in example D. In this manner, the ratio of the impurity concentration of the n$^+$-type silicon carbide buffer layer 2 and the impurity concentration of the n-type epitaxial layer 4 was set to be 1 in example A, 3 in example B, 5 in example C, and 8.5 in example D.

FIGS. 5A, 5B, 5C, and 5D are graphs of a FT-IR signal in the examples of the silicon carbide semiconductor substrate according to the embodiment. The horizontal axis represents film thickness and the vertical axis represents FT-IR signal spectrum. The units are µm and percent, respectively. In example A, the impurity concentration of the n$^+$-type silicon carbide buffer layer 2 and the impurity concentration of the n-type epitaxial layer 4 are about the same and therefore, only interference waveform A1 of the surface reflected light Ref. and interface reflected light C is measured. Interference waveform A1 corresponds to Ref.+C in FIG. 3. Therefore, in example A, the film thickness of the n$^+$-type silicon carbide buffer layer 2 cannot be measured.

Meanwhile, in example B, the ratio of the impurity concentration of the n$^+$-type silicon carbide buffer layer 2 and the impurity concentration of the n-type epitaxial layer 4 is 3 and the impurity concentrations differ. Therefore, interference waveform B1 of the surface reflected light Ref. and the interface reflected light C, and interference waveform B2 of the surface reflected light Ref. and the interface reflected light A, B are measured. Interference waveform B1 corresponds to Ref.+C in FIG. 3, and interference waveform B2 corresponds to Ref.+A and Ref.+B in FIG. 3. Here, since the n-type epitaxial layer 4 is thin, the interference waveform of the surface reflected light Ref. and the interface reflected light A and the interference waveform of the surface reflected light Ref. and the interface reflected light B are measured as the same interference waveform. Therefore, in example B, the film thickness of the n$^+$-type silicon carbide buffer layer 2 may be measured from interference waveform B1 and interference waveform B2.

Similarly, in examples C and D, the ratios of the impurity concentration of the n$^+$-type silicon carbide buffer layer 2 and the impurity concentration of the n-type epitaxial layer 4 are 5 and 8.5, respectively and the impurity concentrations differ. Therefore, interference waveforms C1, D1 of the surface reflected light Ref. and the interface reflected light C; and interference waveforms C2, D2 of the surface reflected light Ref. and the interface reflected light A, B are measured. Thus, in examples C and D, the film thickness of the n$^+$-type silicon carbide buffer layer 2 may be measured from interference waveforms C1, D1, and interference waveforms C2, D2.

In this manner, from the examples, it is found that when the ratio of the impurity concentration of the n$^+$-type silicon carbide buffer layer 2 and the impurity concentration of the n-type epitaxial layer 4 is 3 times or more, FT-IR signals are separated, enabling the film thickness of the n$^+$-type silicon carbide buffer layer 2 to be evaluated. Further, from these results, it is found that when the ratio of the impurity concentration of the n$^+$-type silicon carbide substrate 1 and the impurity concentration of the n-type epitaxial layer 4 is 3 times or greater, the FT-IR signals are separated, enabling the film thickness of the n$^+$-type silicon carbide buffer layer 2 to be measured by Fourier transform.

A case in which a pin diode is manufactured from the silicon carbide semiconductor substrate according to the embodiment will be described as an example. For example, in a case where the silicon carbide semiconductor substrate according to the embodiment is an n-type and an n-channel pin diode is manufactured, the n+-type silicon carbide substrate 1 is a cathode region, the n+-type silicon carbide buffer layer 2 functions as a buffer layer, and the n-type drift layer 3 functions as an intrinsic semiconductor (i-layer). First, in a surface layer on a side of the n-type drift layer 3 opposite the side facing the n+-type silicon carbide buffer layer 2, a p-type impurity, for example, aluminum (Al) is ion implanted, whereby a p+-type anode region is formed. Next, on an upper surface of the anode region, an anode electrode is formed using nickel (Ni) or the like, and on an upper surface of the cathode region, a cathode electrode is formed. As a result, the n-channel pin diode is manufactured.

Here, for example, the impurity concentration of the n-type epitaxial layer 4 is 1/100 or less of the impurity concentration of the n-type drift layer 3 and the film thickness of the n-type epitaxial layer 4 is 1/10 or less of the film thickness of the n-type drift layer 3. As a result, the resistance of the n-type epitaxial layer 4 becomes 1/1000 or less of the resistance of the n-type drift layer 3. Therefore, the n-type epitaxial layer 4 does not become a large component of the resistance and does not negatively affect the performance of n-channel pin diode in a significant way.

Further, here, although an n-channel pin diode is described as an example of the method of manufacturing a semiconductor device, the semiconductor substrate of the present invention is further applicable to bipolar devices, Insulated Gate Bipolar Transistor (IGBT) devices, parasitic diodes of a Metal Oxide Semiconductor (MOS) structure, and the like. Further, in the embodiment, although an example has been described in which the n-type epitaxial layer 4, the n+-type silicon carbide buffer layer 2, and the n-type drift layer 3 are stacked on the front surface of the n+-type silicon carbide substrate 1, configuration may be such that a p-type epitaxial layer, a p+-type silicon carbide buffer layer, and a p-type drift layer are stacked on a front surface of a p+-type silicon carbide substrate.

As described, according to the silicon carbide semiconductor substrate of the embodiment, infrared light is reflected by the interface of the n+-type silicon carbide substrate and the n-type epitaxial layer, or the interface of the n-type epitaxial layer and the n+-type silicon carbide buffer layer and therefore, the film thickness of the n+-type silicon carbide buffer layer may be measured by Fourier transform from the interference waveform of the surface reflected light and the interface reflected light. Thus, it becomes possible to measure the thickness of the n+-type silicon carbide buffer layer by a conventional FT-IR method. As a result, for example, the film thickness of the n+-type silicon carbide buffer layer may be evaluated and managed, which may contribute to improved yield of the silicon carbide semiconductor substrate.

Further, the impurity concentration of the n-type epitaxial layer is 1/3 or less of the impurity concentration of the n+-type silicon carbide substrate or 1/3 or less of the impurity concentration of the n+-type silicon carbide buffer layer, whereby the reflected light at the interface becomes stronger, enabling the interference waveform of the surface reflected light and the interface reflected light to be obtained.

Further, the film thickness of the n-type epitaxial layer is 5 μm or less, whereby the resistance of the n-type epitaxial layer is suppressed, enabling increases in the resistance caused by the n-type epitaxial layer to be suppressed. Further, the impurity concentration of the n-type epitaxial layer is $1\times10^{17}/cm^3$ or higher, whereby the resistance of the n-type epitaxial layer is suppressed, enabling increases in the resistance caused by the n-type epitaxial layer to be suppressed.

According to the embodiments, stacking faults may be suppressed by the impurity concentration and thickness of the buffer layer. Further, since infrared light is reflected by the interface of the silicon carbide substrate and the epitaxial layer or the interface of the epitaxial layer and the buffer layer, the thickness of the buffer layer may be measured from the interference waveform of the surface reflected light and the interface reflected light by Fourier transform. Therefore, measurement of the thickness of the buffer layer by a conventional FT-IR method becomes possible. As a result, for example, the film thickness of the buffer layer may be evaluated and managed, which may contribute to improved yield of the silicon carbide semiconductor substrate.

Further, the impurity concentration of the epitaxial layer is 1/3 or less of the impurity concentration of the silicon carbide substrate or the buffer layer, whereby the reflected light at the interface becomes stronger, enabling an interference waveform of the surface reflected light and the interface reflected light to be obtained.

Further, the film thickness of the epitaxial layer is 5 μm or less, whereby the resistance of the epitaxial layer is suppressed, enabling increases in the resistance caused by the epitaxial layer to be suppressed. The impurity concentration of the epitaxial layer is $1\times10^{17}/cm^3$ or higher, whereby the resistance of the epitaxial layer is suppressed, enabling increases in the resistance caused by the epitaxial layer to be suppressed.

The silicon carbide semiconductor substrate, the method of manufacturing a silicon carbide semiconductor substrate, the semiconductor device, and the method of manufacturing a semiconductor device according to the embodiments achieve an effect in that even when a buffer layer having an impurity concentration that is about the same as that of the substrate is used to suppress stacking faults, the film thickness of the buffer layer may be measured by a conventional FT-IR method.

As described, the semiconductor substrate according to the embodiments is useful for a semiconductor substrate of a high-voltage semiconductor device used in power converting equipment and power supply devices such as in various industrial machines.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:
1. A silicon carbide semiconductor substrate, comprising:
a silicon carbide substrate of a first conductivity type and having a front surface and a back surface opposite to the front surface;
a silicon carbide epitaxial layer of the first conductivity type, provided at the front surface of the silicon carbide substrate and having a low impurity concentration that is at most one third of an impurity concentration of the silicon carbide substrate, the low impurity concentration being in a range from $1\times10^{17}/cm^3$ to $1\times10^{18}/cm^3$, the silicon carbide epitaxial layer having a film thickness in a range from 1 μm to 5 μm, the silicon carbide epitaxial layer having a first side and a second side opposite to the first side and facing the silicon carbide substrate;

a silicon carbide buffer layer of the first conductivity type, provided at a surface of the first side of the silicon carbide epitaxial layer, the silicon carbide buffer layer having an impurity concentration that is at least three times the low impurity concentration of the silicon carbide epitaxial layer, the silicon carbide buffer layer having a first side and a second side opposite to the first side and facing the silicon carbide substrate; and a silicon carbide drift layer of the first conductivity type, provided at a surface of the first side of the silicon carbide buffer layer, the silicon carbide drift layer having an impurity concentration that is at most one third of the impurity concentration of the silicon carbide buffer layer.

2. The silicon carbide semiconductor substrate according to claim 1, wherein
the impurity concentration of the silicon carbide substrate is in a range from $1 \times 10^{18}/cm^3$ to $2 \times 10^{19}/cm^3$.

3. The silicon carbide semiconductor substrate according to claim 1, wherein
the impurity concentration of the silicon carbide buffer layer is in a range from $1 \times 10^{18}/cm^3$ to $2 \times 10^{19}/cm^3$.

4. A method of manufacturing a silicon carbide semiconductor substrate, the method comprising:

forming a silicon carbide epitaxial layer of a first conductivity type at a front surface of a silicon carbide substrate of the first conductivity type, the silicon carbide epitaxial layer having a low impurity concentration that is at most one third of an impurity concentration of the silicon carbide substrate, the low impurity concentration being in a range from $1 \times 10^{17}/cm^3$ to $1 \times 10^{18}/cm^3$, the silicon carbide epitaxial layer having a film thickness in a range from 1 μm to 5 μm;

forming a silicon carbide buffer layer of the first conductivity type at a surface of a first side of the silicon carbide epitaxial layer, opposite to a second side thereof facing the silicon carbide substrate, the silicon carbide buffer layer having an impurity concentration that is at least three times the low impurity concentration of the silicon carbide epitaxial layer; and forming a silicon carbide drift layer of the first conductivity type, at a surface of a first side of the silicon carbide buffer layer, opposite to a second side thereof facing the silicon carbide substrate, the silicon carbide drift layer having an impurity concentration that is at most one third of the impurity concentration of the silicon carbide buffer layer.

5. The method according to claim 4, wherein
the impurity concentration of the silicon carbide substrate is in a range from $1 \times 10^{18}/cm^3$ to $2 \times 10^{19}/cm^3$.

6. The method according to claim 4, wherein
the impurity concentration of the silicon carbide buffer layer is in a range from $1 \times 10^{18}/cm^3$ to $2 \times 10^{19}/cm^3$.

7. A semiconductor device, comprising:
a silicon carbide substrate of a first conductivity type and having a front surface and a back surface opposite to the front surface;

a silicon carbide epitaxial layer of the first conductivity type, provided at the front surface of the silicon carbide substrate, the silicon carbide epitaxial layer having a low impurity concentration that is at most one third of an impurity concentration of the silicon carbide substrate, the low impurity concentration being in a range from $1 \times 10^{17}/cm^3$ to $1 \times 10^{18}/cm^3$, the silicon carbide epitaxial layer having a film thickness in a range from 1 μm to 5 μm, the silicon carbide epitaxial layer having a first side and a second side opposite to the first side and facing the silicon carbide substrate;

a silicon carbide buffer layer of the first conductivity type, provided at a surface of the first side of the silicon carbide epitaxial layer, the silicon carbide buffer layer having an impurity concentration that is at least three times the low impurity concentration of the silicon carbide epitaxial layer, the silicon carbide buffer layer having a first side and a second side opposite to the first side and facing the silicon carbide substrate; and a silicon carbide drift layer of the first conductivity type, provided at a surface of the first side of the silicon carbide buffer layer, the silicon carbide drift layer having an impurity concentration that is at most one third of the impurity concentration of the silicon carbide buffer layer.

8. The semiconductor device according to claim 7, wherein
the impurity concentration of the silicon carbide substrate is in a range from $1 \times 10^{18}/cm^3$ to $2 \times 10^{19}/cm^3$.

9. The semiconductor device according to claim 7, wherein
the impurity concentration of the silicon carbide buffer layer is in a range from $1 \times 10^{18}/cm^3$ to $2 \times 10^{19}/cm^3$.

* * * * *